(12) United States Patent
Shi et al.

(10) Patent No.: US 7,556,992 B2
(45) Date of Patent: Jul. 7, 2009

(54) METHOD FOR FORMING VERTICAL STRUCTURES IN A SEMICONDUCTOR DEVICE

(75) Inventors: Zhonghai Shi, Austin, TX (US); Voon-Yew Thean, Austin, TX (US); Ted R. White, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 198 days.

(21) Appl. No.: 11/496,106

(22) Filed: Jul. 31, 2006

(65) Prior Publication Data

US 2008/0023803 A1    Jan. 31, 2008

(51) Int. Cl.
*H01L 21/00* (2006.01)
*H01L 21/84* (2006.01)

(52) U.S. Cl. ............... 438/164; 438/259; 257/E21.561
(58) Field of Classification Search ......... 438/149–151, 438/283, 388, 164, 259, 270; 257/623
See application file for complete search history.

(56) References Cited

U.S. PATENT DOCUMENTS 5,082,795 A * 1/1992 Temple .................. 438/138
6,872,647 B1 * 3/2005 Yu et al. ................. 438/585
6,949,460 B2   9/2005 Wagganer et al.
2004/0156108 A1  8/2004 Chou et al.
2005/0093021 A1 * 5/2005 Ouyang et al. .......... 257/194

OTHER PUBLICATIONS

Choi et al., "Sub-20nm CMOS FinFET Technologies"; Dept. of Elec. Eng. and Computer Sciences; Univ. of CA, Berkeley; 2001 IEEE; 4 pages.
Liu et al.; Multi-FIN Double-Gate MOSFET Fabricated by Using (110)-Oriented SOI Wafers and Orientation-Dependent Etching; Elec. Soc. Proc., vol. 2003-06; pp. 566-571.

* cited by examiner

*Primary Examiner*—Phat X Cao
*Assistant Examiner*—Nga Doan
(74) *Attorney, Agent, or Firm*—John A. Fortkort; Fortkort & Houston P.C.

(57) ABSTRACT

A method is provided for making a semiconductor device, comprising (a) providing a semiconductor stack comprising a first semiconductor layer (407) having a <110> crystallographic orientation and a second semiconductor layer (405) having a <100> crystallographic orientation; (b) defining an oxide mask (415) in the first semiconductor layer; and (c) utilizing the oxide mask to pattern the second semiconductor layer.

22 Claims, 5 Drawing Sheets

METHOD FOR FORMING VERTICAL STRUCTURES IN A SEMICONDUCTOR DEVICE

FIELD OF THE DISCLOSURE

The present disclosure relates generally to semiconductor devices, and more particularly to methods for making FinFETs and other semiconductor devices having vertical structures.

BACKGROUND OF THE DISCLOSURE

The well known and ongoing movement in the semiconductor industry toward further miniaturization of semiconductor devices has required regular increases in the density of devices placed on IC substrates. This, in turn, has necessitated reductions in the dimensions of the devices themselves and of their components. For example, the dimensions of gates, and the channel separation of source and drain elements, have become progressively smaller.

The aforementioned trend presents issues for the performance characteristics, reliability, and durability of semiconductor devices. In particular, as semiconductor devices continue to shrink in size, problems with short channel effects, punch-through, and current leakage become more pronounced. These problems have significant adverse impacts on the performance of semiconductor devices, and greatly complicate the manufacturing processes used to fabricate these devices.

In particular, as channel lengths are reduced, the source and drain depletion regions are disposed in closer proximity to each other. In such short channel devices, the drain begins to influence the channel and reduces the influence of the gate. This phenomenon is known as the short channel effect. The impact of the short channel effect on device performance is often manifested as a reduction in the device threshold voltage or as an increase in the sub-threshold current.

One method for reducing or eliminating short channel effects is to reduce the thickness of the channel region between the source and drain. This may be accomplished, for example, through the use of FDSOI devices or ultra-thin body devices. Even better short channel control is possible by providing gates on either side of this thin channel region, since two gates control the thin silicon channel region much more effectively than one and reduce the influence of the drain on the channel.

One of the outcomes of the continuing efforts to resolve the short channel effect and the other problems as noted above has been the development of FinFETs. FinFETs are field effect transistors (FETs) that are equipped with a gate electrode controlling a thin vertical fin-shaped channel region. One example of such a device is depicted in FIG. 1. The device depicted therein is fabricated on a dielectric layer 2 and includes a silicon drain island 4 and a source island 6 that are connected by a silicon fin or channel 8. The source, drain, and channel are covered by a dielectric layer or hard mask 9 during a stage of the process, and a gate 11 extends across both sides of the channel fin 8 and is isolated from the gate 11 by a gate oxide (not shown). Thus, inversion layers are formed on both sides of the channel. Such a structure has the advantage of providing double gates to effectively suppress the short channel effect and to enhance drive current. Also, since the channels are parallel planes, parasitic corner effects are overcome. Moreover, since the fin is very thin, doping of the fin may not be required in order to suppress the short channel effect.

While FinFET devices such as that depicted in FIG. 1 have many advantages, there is still a need in the art for further improvements in these devices. For example, in some conventional FinFET designs, when more current is needed from a FinFET, fins are added in parallel with the gate extending over each of the fins. Hence, in order to get increased current for a given area, the pitch of the fins (that is, the distance equal to the width of the fins and the space between the fins) has to be minimized. Unfortunately, it has proven difficult to achieve further reductions in the pitch of FINFET devices beyond the values already achieved, due to fundamental limitations in existing lithography techniques. In particular, the line edge roughness (LER, which is a measure of the variation in line width along the length of a line), parallelism of the two fin sidewalls, and critical dimension (CD) variation attendant to these processes present problems for good manufacturability.

There is thus a need in the art for devices and methodologies which overcome this problem. This and other needs may be met by the devices and methodologies described herein.

DETAILED DESCRIPTION

Figure 1:
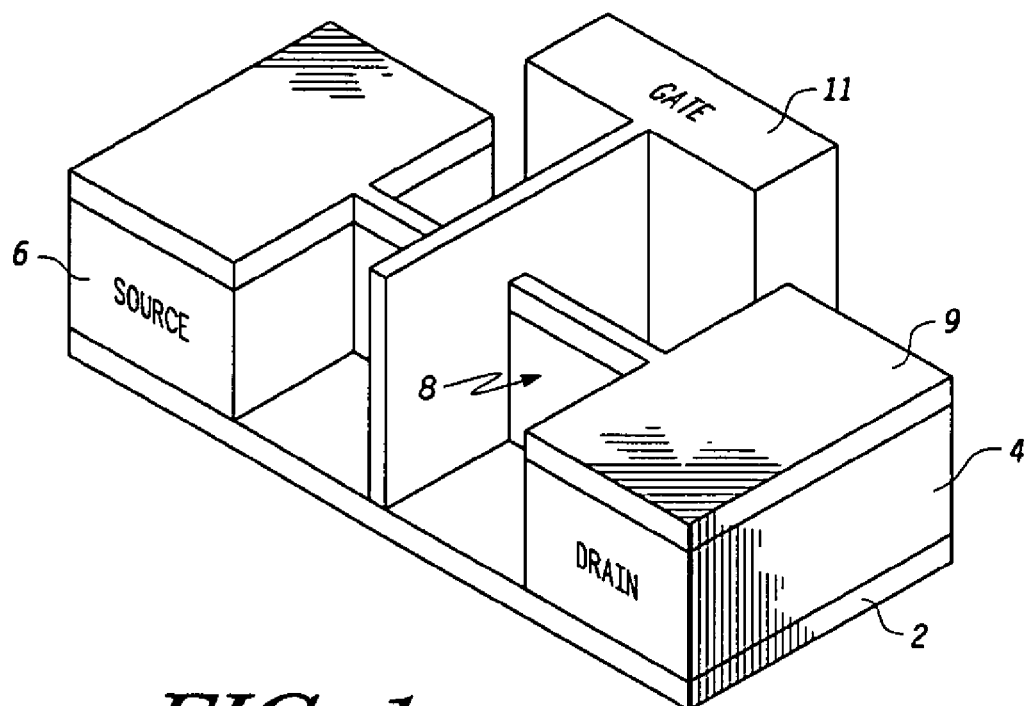
FIG. 1 is an illustration of a prior art FinFET device.

In one aspect, a method for making a semiconductor device is provided which comprises (a) providing a semiconductor stack including first and second semiconductor layers which comprise first and second semiconductor materials, respectively; (b) oxidizing the first semiconductor layer, thereby forming an oxide mask; and (c) patterning the second semiconductor layer with the oxide mask.

In another aspect, a method for making a semiconductor device is provided which comprises (a) forming a hard mask over a semiconductor stack containing first and second semiconductor layers, wherein the first semiconductor layer comprises a first semiconductor material and has a (100) surface orientation and a <110> or <100> channel direction, and wherein the second semiconductor layer comprises a second semiconductor material and has a (110) surface orientation and a <211> direction parallel to the channel direction of the first semiconductor layer; (b) patterning the second semiconductor layer to form a plurality of mesas therein capped by the hard mask; (c) oxidizing the exposed surfaces of the patterned second semiconductor layer; (d) removing the hard mask, thereby exposing a portion of the second semiconductor material; (e) etching the exposed portion of the second semiconductor material, thereby forming an oxide mask; and (f) patterning the first semiconductor layer with the oxide mask.

In a further aspect, a semiconductor device is provided which comprises (a) a first semiconductor layer comprising a first semiconductor material and having a (100) surface orientation and a <110> or <100> channel direction; (b) a second semiconductor layer comprising a second semiconductor material and having a (110) surface orientation and a <211> direction parallel to the channel direction of the first semiconductor layer, wherein said second semiconductor layer has a plurality of mesas defined therein; and (c) a hard mask disposed over said second semiconductor layer such that each of the plurality of mesas is capped with the hard mask.

These and other aspects of the present disclosure are described in greater detail below.

It has now been found that the aforementioned infirmities may be overcome through the provision of a method that combines wet etch and layer transfer techniques to obtain a pattern in an active (or device) layer having very low line edge roughness (LER), fin sidewalls with high parallelism, and critical dimension (CD) variation. This is preferably achieved by creating a desired pattern in a sacrificial (preferably semiconductor) layer, and then transferring the pattern to an active (or device) semiconductor layer. The methodology described herein may be used to increase feature density in FinFET transistors and other semiconductor devices beyond the limits fundamental to the photolithographic techniques currently known in the art, and also offers a means for controlling fin thickness in such devices to a high degree.

Preferably, in the devices and methodologies described herein, the sacrificial layer has a first crystallographic orientation, and the active layer preferably has a second crystallographic orientation that is distinct from the first crystallographic orientation. Thus, for example, the sacrificial layer may be silicon with a (110) surface orientation and a <211> direction parallel to the channel direction of the active semiconductor layer, and the device layer may be silicon with a (100) surface orientation, the channel direction being <110> or <100>. These crystallographic orientations permit the use of a timed wet etch which is highly anisotropic, due to the <110> crystallographic orientation of the sacrificial semiconductor layer and, in particular, the large differences in etch rates experienced in different directions with respect to the crystallographic plane. Hence, in some embodiments, this etch can be used to form trenches (and therefore FinFETs and other vertical structures) with sidewalls that are extremely smooth and almost perfectly vertical.

Figure 2:
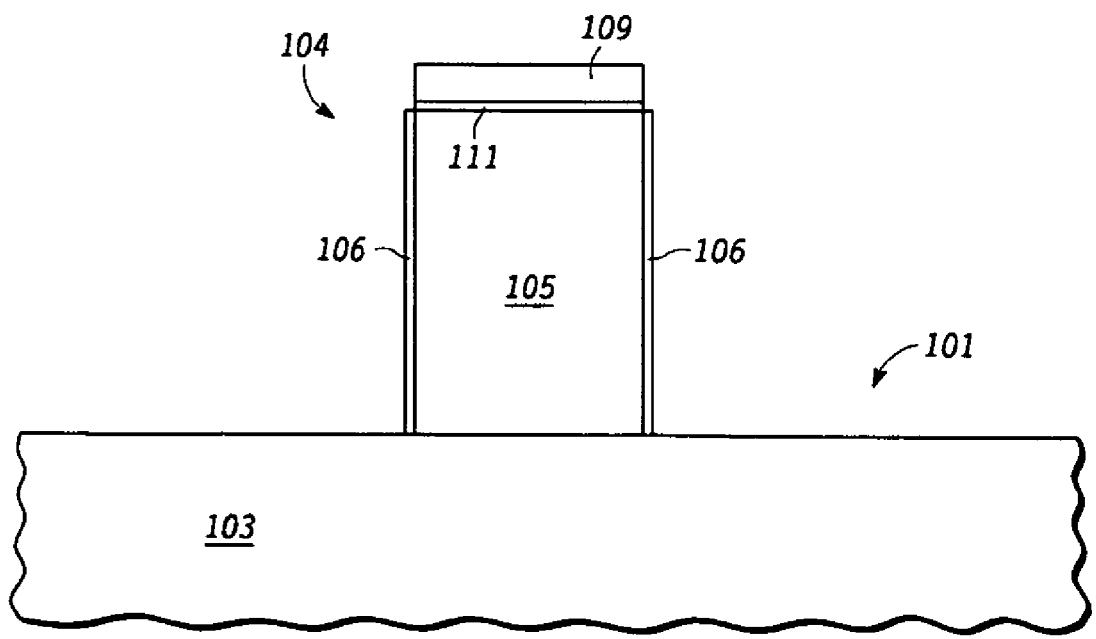
FIG. 2 is an illustration of a step in a prior art process for fabricating FinFET devices.
Figure 3:
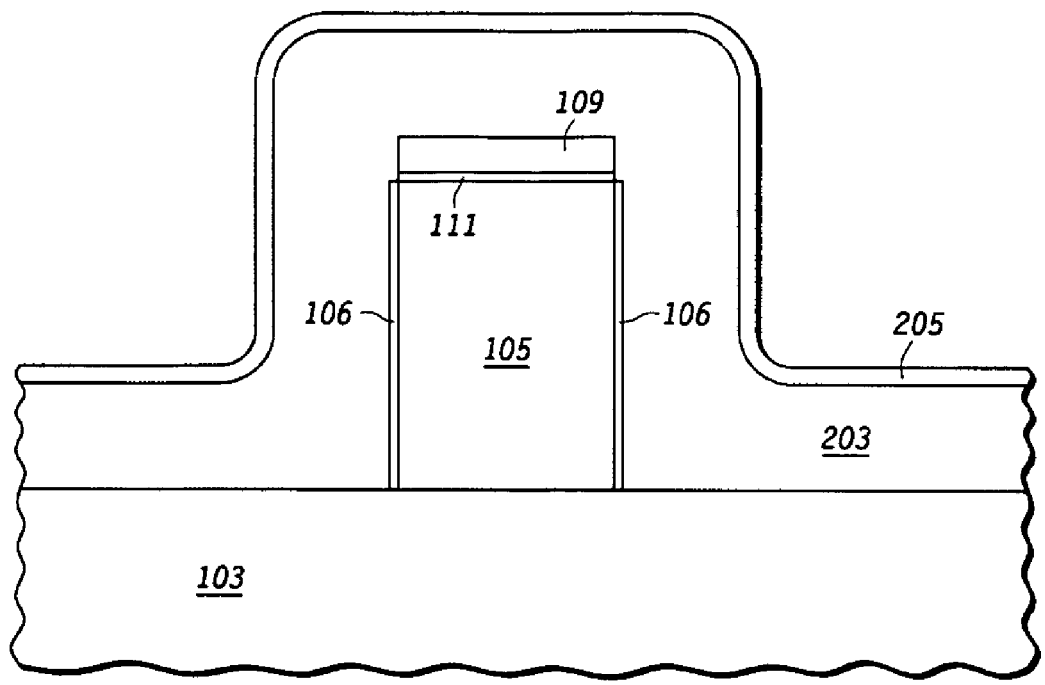
FIG. 3 is an illustration of a step in a prior art process for fabricating FinFET devices.
Figure 4:
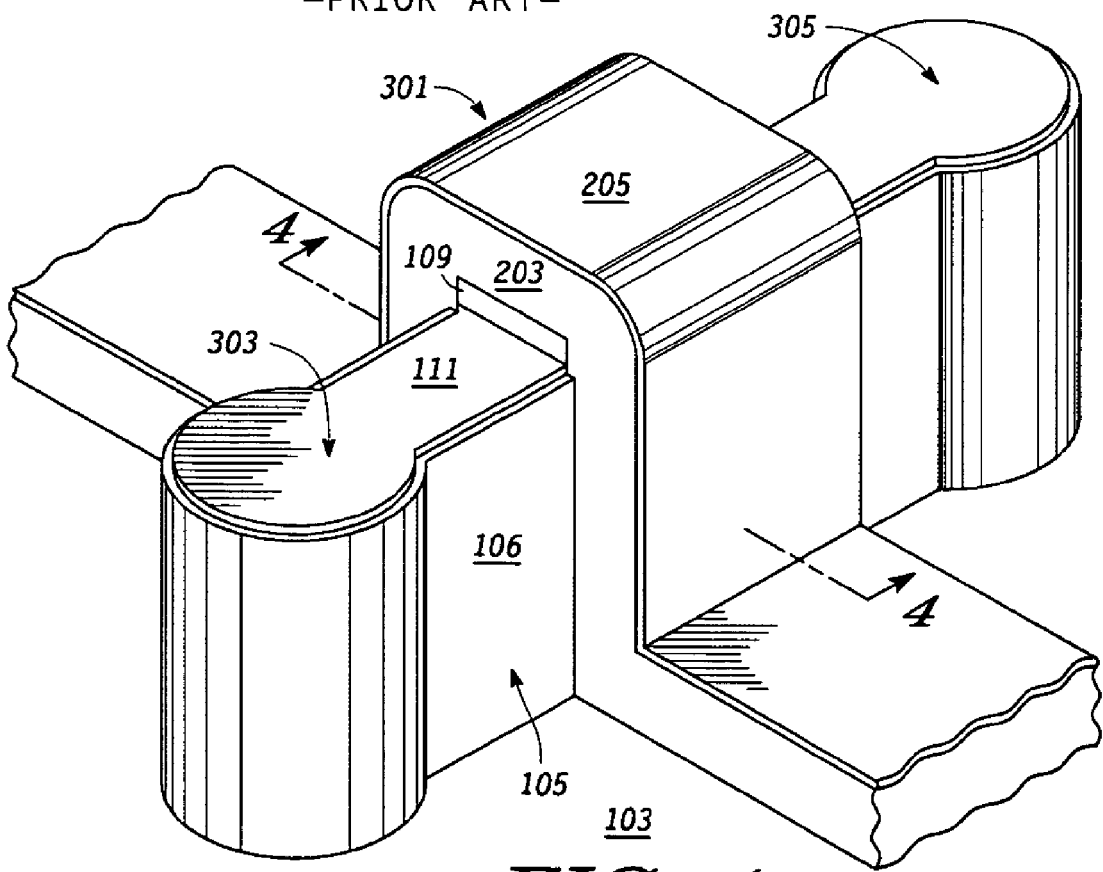
FIG. 4 is an illustration of a step in a prior art process for fabricating FinFET devices.

The methodologies disclosed herein may be further understood by first considering the prior art process depicted in FIGS. 2-4. FIG. 2 shows a partial side cross-sectional view of a semiconductor wafer during a stage in the manufacture of a transistor according to a prior art process. The wafer 101 includes an insulating layer 103. A structure 104 has been formed over insulating layer 103. The structure 104 includes a semiconductor structure portion 105 formed over insulating layer 103, a dielectric portion 111 (e.g. silicon dioxide) formed over semiconductor structure portion 105 and insulating layer 103, and a nitride portion 109 located over dielectric portion 111 and semiconductor structure portion 105.

The structure 104 may be formed by depositing a layer of semiconductor material over insulating layer 103, forming a dielectric layer over the semiconductor layer (as by thermal oxidation of the semiconductor layer or by atomic layer deposition of a high K dielectric), and then depositing a layer of nitride over the dielectric layer. The semiconductor layer 105, the dielectric layer 111, and the nitride layer 109 are then patterned using photolithographic techniques to form structure 104. Afterwards, a dielectric layer 106 is formed on the sidewalls of semiconductor structure portion 105. In later processing steps, a channel region and current terminal regions of a transistor are formed in semiconductor structure portion 105 of structure 104. Semiconductor structure portion 105 may be made of single crystal silicon or polysilicon bonded on insulating layer 103.

Referring now to FIG. 3, a conformal polysilicon layer 203 is deposited over wafer 101 including over structure 104. In later processing steps, polysilicon layer 203 is utilized to form the independent gate structures of a FinFET transistor. In the embodiment shown, a conformal nitride layer 205 is then deposited over layer 203. Conformal nitride layer 205 may be used both as an antireflective coating and as a hard mask for etching layer 203.

FIG. 4 is a partial isometric view of wafer 101 after layers 205 and 203 have been patterned to form gate structure 301. Layers 205 and 203 are patterned by the utilization of conventional photolithographic techniques. During the patterning, the portion of nitride portion 109 located over structure 104 but not located under gate structure 301 is removed. The additional processing steps used to complete the FinFET device are well known in the art and may be found, for example, in commonly assigned U.S. Patent application 2004/0235300 (Mathew et al.).

While the process depicted in FIGS. 2-4 represents a notable improvement in the art, as noted above, this process relies on photolithographic techniques to define the fins of the device. Consequently, the fin pitch, line edge roughness (LER) and critical dimension (CD) variation attainable with this process may be limited to the values currently attainable by photolithography.

Figure 5:
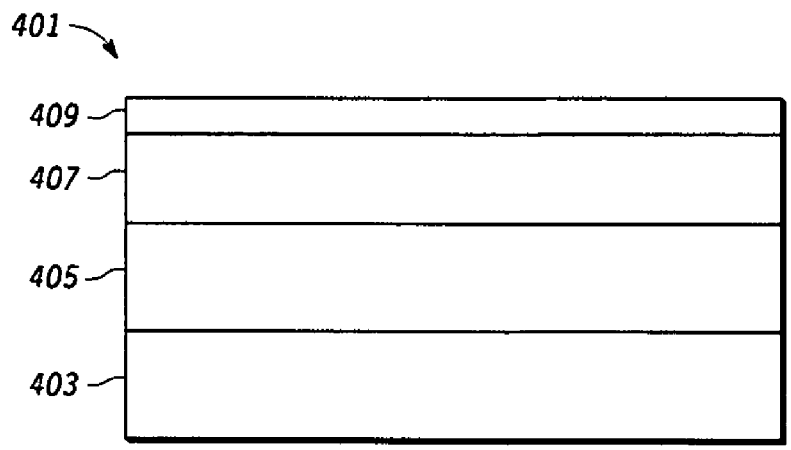
FIG. 5 is an illustration of a step in one embodiment of a process for fabricating FinFET devices in accordance with the teachings herein.

FIGS. 5-12 illustrate a first particular, non-limiting embodiment of a process in accordance with the teachings herein. With reference to FIG. 5, a wafer stack 401 is provided which comprises a buried oxide (BOX) 403, an active semiconductor layer 405 (from an SOI wafer) having a (100) surface orientation and a <110> or <100> channel direction (in this embodiment, active semiconductor layer 405 serves as the active or device layer), a sacrificial semiconductor layer 407 having a (110) surface orientation and a <211> direction parallel to the channel direction of active semiconductor layer 405 (in this embodiment, sacrificial semiconductor layer 407 acts as a sacrificial pattern transfer layer), and a layer of SiN 409. Such a structure may be achieved, for example, through wafer bonding followed by SiN deposition.

Figure 6:
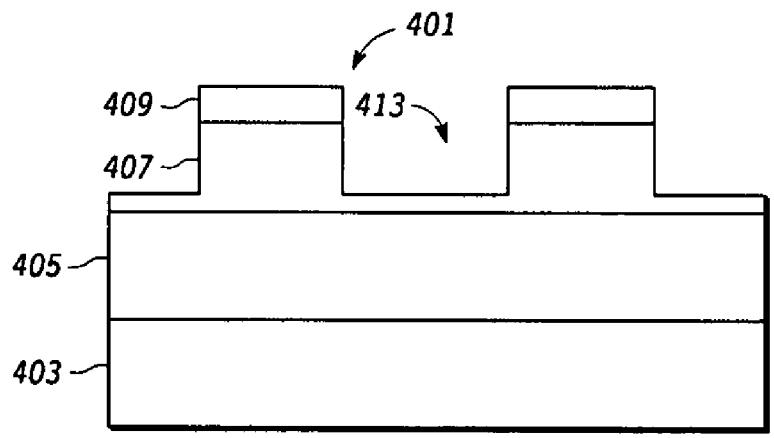
FIG. 6 is an illustration of a step in one embodiment of a process for fabricating FinFET devices in accordance with the teachings herein.

Referring now to FIG. 6, the layer of SiN 409 is patterned using suitable photolithographic techniques, which preferably include use of a photomask in conjunction with a dry etch. The dry etch may be, for example, reactive ion etching (RIE) using $CF_4$. The layer of SiN 409 is then used as a hard mask for patterning the underlying sacrificial semiconductor layer 407. One skilled in the art will appreciate that other materials as are known to the art may be substituted for SiN. However, the use of SiN is preferred in the process described herein due to its desirable optical properties (in particular, it can be made to have low reflectivity and an index of refraction which closely matches that of silicon) which help to optimize the photolithography process.

After the hard mask has been formed and the photoresist is stripped, a timed wet etch is utilized to pattern sacrificial semiconductor layer 407. The timed wet etch (which may utilize, for example, an aqueous KOH solution) is highly anisotropic, due to the <110> crystallographic orientation of sacrificial semiconductor layer 407 and, in particular, the large differences in etch rates experienced in different directions with respect to the crystallographic plane. Hence, in some embodiments, this etch can be used to form trenches with sidewalls that are extremely smooth and almost perfectly vertical.

After the aforementioned steps, the structure appears as depicted in FIG. 6, with a plurality of mesas 411 separated by trenches 413. The etch of sacrificial semiconductor layer 407 is preferably incomplete so as to leave a portion of the semiconductor material of that layer at the bottom of the trench 413. Though not preferred, in some embodiments, an etch with a desired degree of isotropy may be used to etch sacrificial semiconductor layer 407 so as to further thin the mesas 411 which, as seen below, may result in further reduction of feature pitch.

Figure 7:
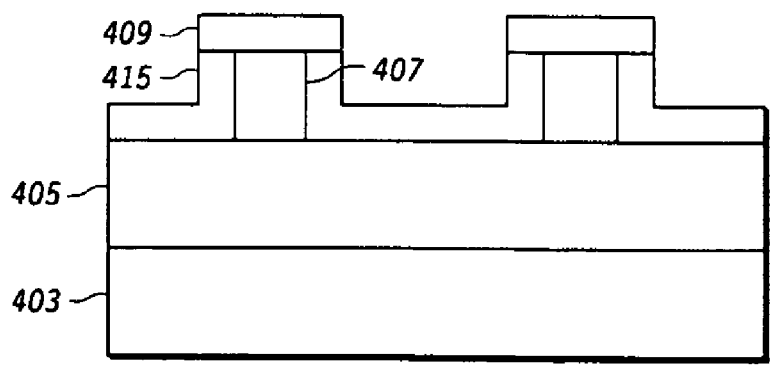
FIG. 7 is an illustration of a step in one embodiment of a process for fabricating FinFET devices in accordance with the teachings herein.

Referring now to FIG. 7, sacrificial semiconductor layer 407 is subjected to thermal oxidation to form a layer of oxide 415 thereon. Preferably, this oxidation step consumes the remaining portion of the semiconductor material at the bottom of the trench 413, as well as a portion of sacrificial semiconductor layer 407 which forms the sidewalls of the trench 413. Various oxidation processes may be used for this step, including, but not limited to, dry oxidation in an oxygen/inert gas atmosphere comprising about 6% by volume of HCl at a temperature within the range of about 700° C. to about 1000° C. The inert gas may be, for example, nitrogen or argon. As described below, the layer of oxide 415 formed on the sidewalls of the trench is subsequently used as a hard mask to form device features in underlying active semiconductor layer 405.

Figure 8:
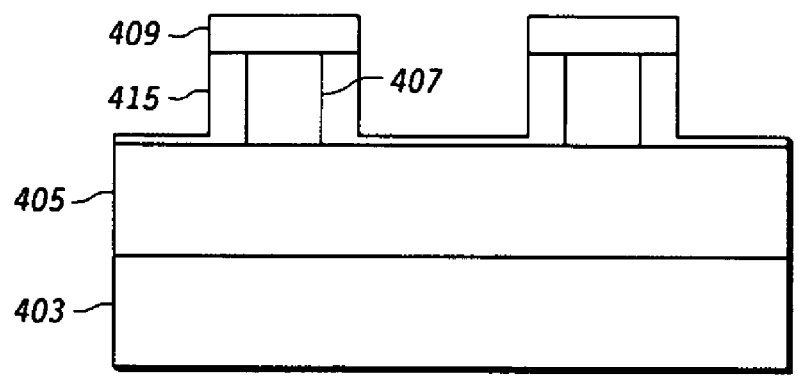
FIG. 8 is an illustration of a step in one embodiment of a process for fabricating FinFET devices in accordance with the teachings herein.

Referring now to FIG. 8, the horizontal portions of the layer of oxide 415 are thinned down with an anisotropic RIE dry etch using the layer of SiN 409 as a hard mask. The RIE etch is preferably a chlorine-based etch which may utilize, for example, $BCl_3$ or other suitable materials. Though not preferred, in some embodiments, the anisotropy of this etch can be manipulated to produce a desired level of thinning in the vertical portions of the layer of oxide 415 which, as seen below, may result in further reduction of the fin pitch.

Figure 9:
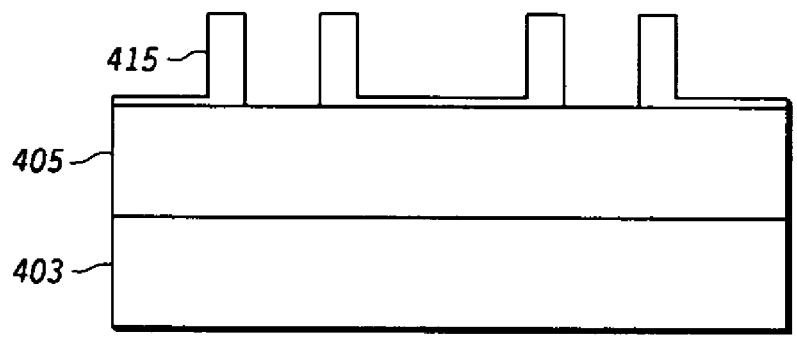
FIG. 9 is an illustration of a step in one embodiment of a process for fabricating FinFET devices in accordance with the teachings herein.

As shown in FIG. 9, the SiN hard mask 409 is then removed through etching with hot aqueous phosphoric acid, which may be heated, for example, to about 90° C. In some embodiments, other techniques known to the art, such as chemical mechanical planarization (CMP), may be used for this purpose.

Figure 10:
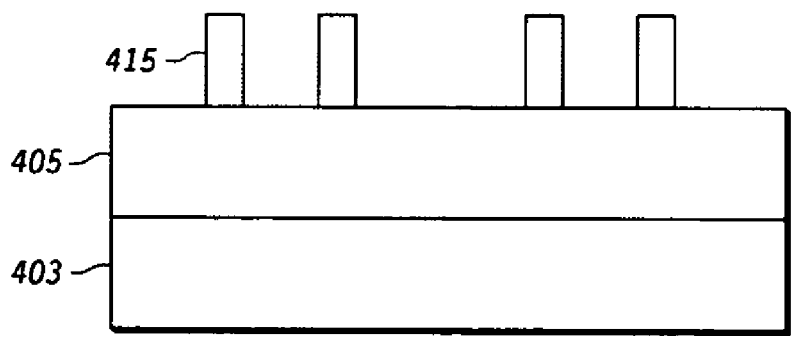
FIG. 10 is an illustration of a step in one embodiment of a process for fabricating FinFET devices in accordance with the teachings herein.

The exposed remaining portion of <110> sacrificial semiconductor layer 407 is then etched with a suitable, and preferably timed, dry or wet etch that is selective to the oxide layer 415. The oxide layer 415 serves as an etch mask during this step with respect to the underlying semiconductor layer 405. The remaining horizontal portion of the oxide layer 415 is then removed with a suitable etchant, such as a dilute aqueous HF solution, as shown in FIG. 10. Preferably, the concentration of this HF solution by weight is at least about 200:1 water to HF, more preferably at least about 600:1 water to HF, and most preferably about 1200:1 water to HF. The etch used for this purpose is also preferably an isotropic timed etch although, in some embodiments, etches having varying degrees of anisotropy may also be used in this step. The duration of this etch can be manipulated to produce a desired level of thinning in the vertical portions of the layer of oxide 415 which, as seen below, may result in further reduction of the feature pitch.

It will be appreciated that, at this point in the process, an ultra-fine oxide pattern has been formed over active semiconductor layer 405. The remaining steps defined below utilize this oxide pattern as a hard mask to etch the underlying active semiconductor layer 405, thereby imparting the mask features to this layer. Hence, the dimensions of those features are ultimately determined by the oxidation step, rather than the photolithography used to define the mesas 411 (see FIG. 6), and are sub-lithographic. Indeed, it will be appreciated that the feature pitch afforded by this approach may be less than half of the minimum feature pitch afforded by the photolithographic techniques used to define the mesa structures 411. Moreover, because these features are formed by an oxidation process rather than through photolithography, feature dimensions can be controlled to a much higher degree. It is also to be noted that this hard mask etch approach may be capable of reproducing the pattern defined in the hard mask with much greater accuracy than a comparable photomask approach.

Referring now to FIG. 1, the remaining portions of the oxide layer 415 are used as a hard mask to etch the underlying active semiconductor layer 405 so as to define the fins of the FinFET device therein. This etch is preferably a timed RIE etch using $HBr/NF_3/O_2/SF_6$ or another suitable chemistry, and is continued until only a very thin portion of active semiconductor layer 405 is left between the resulting mesas 417. In some embodiments, rather than relying on a timed etch, active semiconductor layer 405 may be doped in the vicinity of the BOX 403 to serve as an etch stop indicator.

Figure 11:
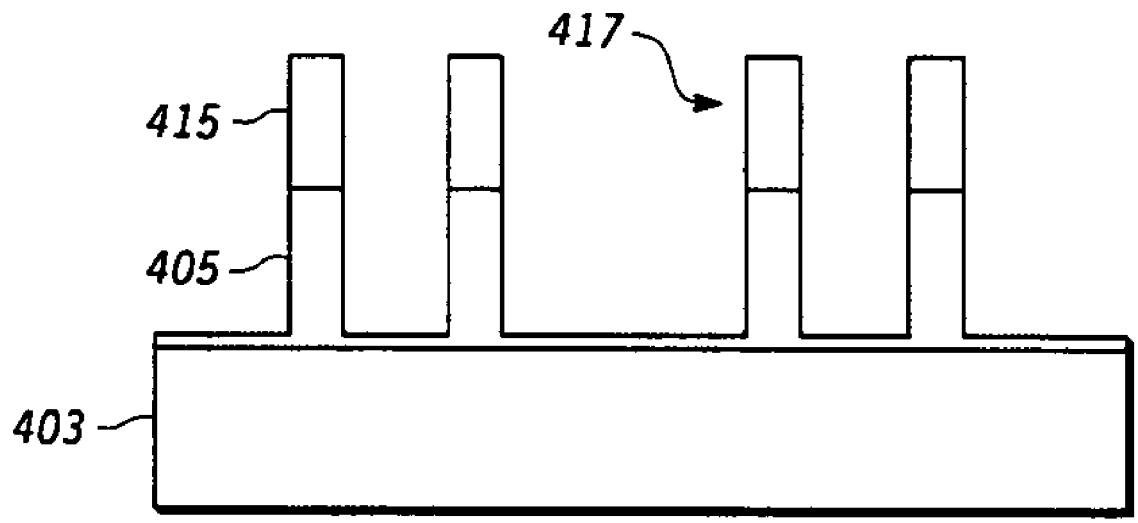
FIG. 11 is an illustration of a step in one embodiment of a process for fabricating FinFET devices in accordance with the teachings herein.
Figure 12:
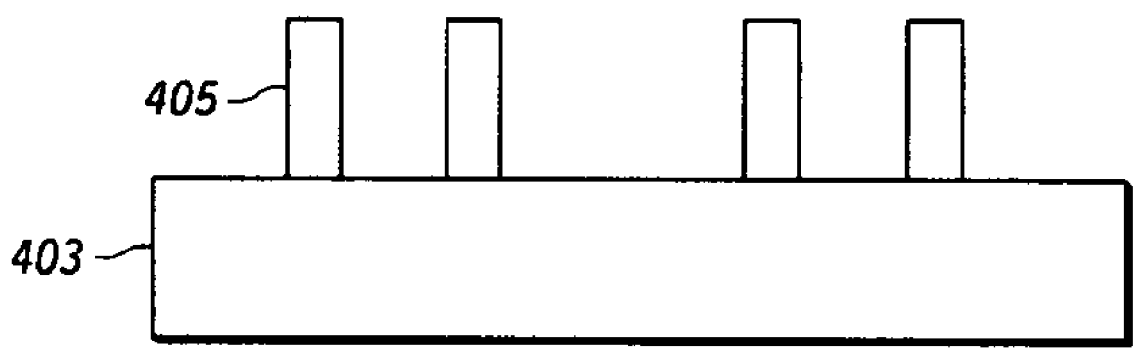
FIG. 12 is an illustration of a step in one embodiment of a process for fabricating FinFET devices in accordance with the teachings herein.

Referring now to FIG. 12, the oxide hard mask 415 of FIG. 11 is removed with a suitable etch, such as aqueous HF, which is preferably selective to active semiconductor layer 405. Another RIE etch is utilized to remove the remaining horizontal portions of active semiconductor layer 405. Alternatively, an oxidation can be used to consume the horizontal portions of active semiconductor layer 405, which can thin the fins further, and which may also reduce the height of the fins somewhat. With the choice of an appropriate etchant, no undercutting of the BOX 403 occurs. The height of the fins may be reduced by a small amount in this process, which can be compensated for, if desired, by starting with an active semiconductor layer 405 that is slightly thicker than the target height of the fins.

Once the fins have been defined with the desired thickness as shown in FIG. 12, the FinFET device may be completed using additional processing steps that are well known in the art and which may be found, for example, in commonly assigned U.S. Patent application 2004/0235300 (Mathew et al.), which is incorporated herein by reference.

Several variations are possible in the methodology described above. For example, in some embodiments, an oxide layer or other dielectric layer may be disposed between the silicon nitride layer 409 and sacrificial semiconductor layer 407 (see FIG. 5). An oxide layer or other dielectric layer may also be disposed between active semiconductor layer 405 and the BOX 403, where it could be used, for example, as an adhesion promoter or etch stop between these two layers during the fabrication of the FinFET. In some embodiments, the BOX 403 may not be present, thereby resulting in a structure in which FinFETs are disposed on a bulk Si substrate. In some embodiments, there may also be an oxide or other dielectric layer between sacrificial semiconducting layer 407 and active semiconducting layer 405. Moreover, while the sacrificial semiconductor layer 407 and active semiconductor layer 405 are preferably both silicon, one skilled in the art will appreciate that, in various embodiments of the devices and methodologies described herein, other semiconductor materials may be used instead, including, for example, germanium or silicon germanium, with appropriate modifications to the processing parameters.

Moreover, while the processes described herein are particularly suitable for the fabrication of dense FinFET devices, it will be appreciated that these methodologies may be used more generally in the fabrication of a wide variety of semiconductor devices and structures. Thus, for example, the methodologies described herein may be utilized in a variety of semiconductor fabrication processes, especially where low CD variation and low LER are desirable, including, for example, the fabrication of accelerometers and other MEMS devices.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   forming a mask over a semiconductor stack, wherein the stack includes a first semiconductor layer comprising a first semiconductor material and having a (100) surface orientation and a channel direction selected from the group consisting of <110> and <100>channel directions, and a second semiconductor layer comprising a second semiconductor material and having a (110) surface orientation and a <211> direction parallel to the channel direction of the first semiconductor layer;
   patterning the second semiconductor layer to form a plurality of mesas therein capped by the mask;
   oxidizing the exposed surfaces of the patterned second semiconductor layer;
   removing the mask, thereby exposing a portion of the second semiconductor material;
   etching the exposed portion of the second semiconductor material; and
   patterning the first semiconductor layer with the oxidized surfaces of the second semiconductor layer.

2. The method of claim 1, wherein the step of etching the exposed portion of the second semiconductor material exposes a portion of the first semiconductor layer.

3. The method of claim 1, wherein the semiconductor device is a FinFET.

4. The method of claim 1, wherein patterning the first semiconductor layer comprises:
   forming a nitride mask on the first semiconductor layer; and
   etching the first semiconductor layer through the nitride mask.

5. The method of claim 4, wherein forming a nitride mask comprises:
   depositing a layer of nitride over the first semiconductor layer; and
   patterning the layer of nitride.

6. The method of claim 1, wherein the second semiconductor layer is essentially planar, and wherein each of the plurality of mesas have sidewalls that are essentially perpendicular to the plane of the second semiconductor layer.

7. The method of claim 1, wherein each of the plurality of mesas comprises a core of the first semiconductor material having an outer layer of oxide thereon.

8. The method of claim 1, wherein the step of removing the mask exposes the core of each of the plurality of mesas, and further comprising removing the core by etching.

9. The method of claim 1, wherein the second semiconductor layer is a semiconductor-on-insulator (SOI) layer.

10. The method of claim 1, wherein the semiconductor device is a FinFET.

11. A method for making a semiconductor device, comprising:
   providing a semiconductor stack having first and second semiconductor layers which have first and second distinct crystallographic orientations, respectively, wherein said first semiconductor layer has a mesa defined therein which is capped with a hard mask;
   forming an oxide layer on a side of the mesa;
   removing the hard mask;
   etching the portion of the first semiconductor layer disposed within the mesa; and
   patterning the second semiconductor layer with the oxide layer.

12. The method of claim 11, wherein the oxide layer is formed by oxidizing a side of the mesa.

13. The method of claim 11, wherein the mesa is formed by etching the first semiconductor layer through at least one opening in the hard mask.

14. The method of claim 11, wherein forming an oxide layer on a side of the mesa includes forming first and second oxide layers on first and second sides of the mesa, respectively.

15. The method of claim 11, wherein the hard mask is a nitride mask, and wherein patterning the first semiconductor layer comprises etching the first semiconductor layer through the nitride mask.

16. The method of claim 15, wherein the hard mask is formed by:
   depositing a layer of nitride over the first semiconductor layer; and
   patterning the layer of nitride.

17. The method of claim 11, wherein the second semiconductor layer is essentially planar, and wherein the mesa has sidewalls that are essentially perpendicular to the plane of the second semiconductor layer.

18. The method of claim 11, wherein the mesa comprises a core of the first semiconductor material having an outer layer of oxide thereon.

19. The method of claim 11, wherein the step of removing the hard mask exposes the core of each of the mesa, and further comprising removing the core by etching.

20. The method of claim 11, wherein the second semiconductor layer is a semiconductor-on-insulator (SOI) layer.

21. The method of claim 11, wherein the mask is of essentially uniform thickness.

22. The method of claim 11, wherein the semiconductor device is a FinFET.

* * * * *